(12) United States Patent
Mercado et al.

(10) Patent No.: US 6,897,562 B2
(45) Date of Patent: May 24, 2005

(54) ELECTRONIC COMPONENT AND METHOD OF MANUFACTURING SAME

(75) Inventors: Lei L. Mercado, Gilbert, AZ (US); Tien-Yu Tom Lee, Phoenix, AZ (US); Jay Jui Hsiang Liu, Libertyville, IL (US)

(73) Assignee: Motorola Corporation, Schaumburg, IL (US)

( * ) Notice: Subject to any disclaimer, the term of this patent is extended or adjusted under 35 U.S.C. 154(b) by 0 days.

(21) Appl. No.: 10/411,744

(22) Filed: Apr. 11, 2003

(65) Prior Publication Data

US 2004/0201106 A1 Oct. 14, 2004

(51) Int. Cl.[7] .............................................. H01L 23/02
(52) U.S. Cl. ........................ 257/772; 257/737; 361/719
(58) Field of Search .............................. 257/701–707, 257/772, 737, 738, 678; 361/719–723; 174/250–261

(56) References Cited

U.S. PATENT DOCUMENTS

| | | | |
|---|---|---|---|
| 5,473,512 A | * 12/1995 | Degani et al. ............. 361/730 |
| 6,350,952 B1 | 2/2002 | Gaku et al. | |
| 6,354,844 B1 | 3/2002 | Coico et al. | |
| 6,370,770 B1 | 4/2002 | Fan et al. | |
| 6,371,310 B1 | 4/2002 | Master et al. | |
| 6,375,476 B1 | 4/2002 | Goodwin et al. | |
| 6,379,996 B1 | 4/2002 | Suzuki | |
| 6,380,062 B1 | 4/2002 | Liu | |
| 6,388,318 B1 | 5/2002 | Iwaya et al. | |
| 6,389,689 B2 | 5/2002 | Heo | |
| 6,392,429 B1 | 5/2002 | Hembree et al. | |
| 6,514,792 B2 | * 2/2003 | Katchmar ................... 438/107 |
| 6,713,856 B2 | * 3/2004 | Tsai et al. .................. 257/686 |
| 2003/0002260 A1 | * 1/2003 | Hasebe et al. .............. 361/720 |

* cited by examiner

Primary Examiner—Nathan J. Flynn
Assistant Examiner—Leonardo Andújar
(74) Attorney, Agent, or Firm—Bryan Cave LLP

(57) ABSTRACT

An electronic component includes an organic interposer (160, 460, 560, 660, 760, 860, 960), a semiconductor chip (220) mounted over the organic interposer, copper pads (250, 751, 851) under the organic interposer, a solder attachment (110, 510, 610, 910) between certain ones of the copper pads, and solder interconnects (120, 420) between certain other ones of the copper pads and located around an outer perimeter (111, 511, 911) of the solder attachment. The solder attachment is placed at locations within the electronic component that experience the greatest stress, which may include, for example, locations adjacent to at least a portion of a perimeter (221) of the semiconductor chip. In one embodiment, a surface area of the solder attachment is larger than a surface area of each one of the solder interconnects. In the same or another embodiment, the electronic component includes multiple solder attachments.

21 Claims, 4 Drawing Sheets

ELECTRONIC COMPONENT AND METHOD OF MANUFACTURING SAME

FIELD OF THE INVENTION

This invention relates generally to electronic components, and relates more particularly to electronic component packaging.

BACKGROUND OF THE INVENTION

One of the stages in the manufacturing process of an integrated circuit (IC) is to form a package around a semiconductor chip. The package not only protects the chip from structural or mechanical damage, but also provides a medium for electrically connecting the chip to other electronic components on a printed circuit board. As electronics technology develops, an increasing number of electrical connections must be squeezed into an increasingly smaller package size in order to meet market expectations. Packages with very closely spaced solder connections are referred to as "fine pitch" packages, with the pitch being the distance between center lines of adjacent solder connections. A fine pitch package is further defined herein as a package having no more than one millimeter between solder connections.

Numerous package types have been or are currently being used in the electronics industry. One such package, known as an area array package, has been in use for over twenty years. The electrical connections of an area array package are typically laid out on the bottom surface of the package, partly in an attempt to save space. There are many different kinds of area array packages, including the ball grid array (BGA), the land grid array (LGA), and the pin grid array (PGA). The electrical connections for these packages are typically joints or interconnects made out of an electrically conductive material such as solder.

The finer the pitch of the package, the closer the solder interconnects are to each other, and the smaller each solder interconnect has to be in order to fit in the package. Unfortunately, smaller solder interconnects are weaker than larger solder interconnects, meaning that fine pitch packages tend to have significant solder reliability problems that can shorten the lifetime of the package by thousands of thermal cycles. For example, a 0.8 millimeter-pitch package typically has a reliability that is only approximately 30 percent of the reliability of a 1.27 millimeter-pitch package, and a 0.5 millimeter-pitch package typically has a reliability that is only approximately 10 percent of the reliability of a 1.27 millimeter-pitch package. Accordingly, there exists a need for a fine pitch area array package that offers much greater solder interconnect reliability than do existing packages, and that is capable of operation over many more thermal cycles. Any such package should accomplish these objectives without negatively affecting currently-achievable package thermal resistance values.

BRIEF DESCRIPTION OF THE DRAWINGS

The invention will be better understood from a reading of the following detailed description, taken in conjunction with the accompanying figures in the drawings in which.

Figure 1:
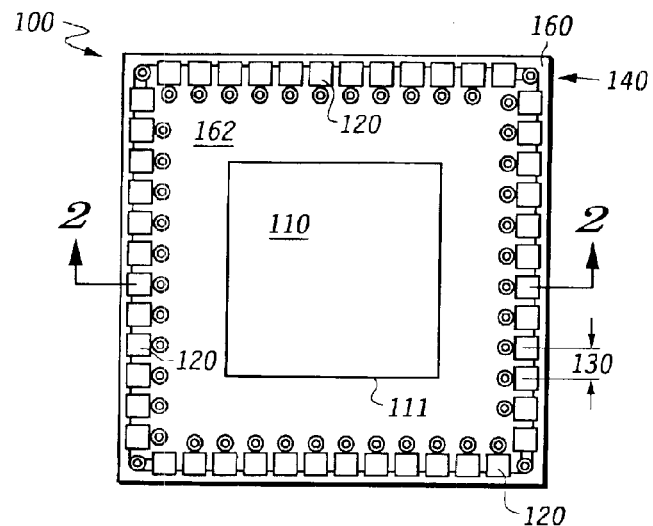
FIG. 1 is a bottom view of an electronic component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The teers "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In an embodiment of the invention disclosed herein, an electronic component includes an organic interposer, a semiconductor chip mounted over the organic interposer, a solder attachment under the organic interposer, and solder interconnects under the organic interposer and located around a perimeter of the solder attachment. The solder attachment is located adjacent to at least a portion of a perimeter of the semiconductor chip. In one embodiment, a surface area of the solder attachment is larger than a surface area of each one of the solder interconnects. The electronic component may include multiple solder attachments.

Referring now to FIG. 1, which is a bottom view of an electronic component according to an embodiment of the invention, an electronic component 100 comprises a single solder attachment 110 and solder interconnects 120 located at a surface 162 of an organic interposer 160. Solder attachment 110 has an outer perimeter 111. A surface area or footprint of solder attachment 110 is larger than a surface area or footprint of each one of solder interconnects 120. Solder interconnects 120 have a pitch 130, which is the spacing between center lines of adjacent solder interconnects 120. In the embodiment illustrated in FIG. 1, solder interconnects 120 are shown as having a square shape, which is typical for LGA packages. It will be understood that if electronic component 100 is, instead, a BGA package, solder interconnects 120 could have a spherical or round shape more typical for that package type.

In one embodiment, electronic component 100 is a fine pitch area array package, meaning, as was described earlier herein, that pitch 130 is no greater than one millimeter. Solder interconnects 120 are located around outer perimeter 111 of solder attachment 110. When an electronic component is mounted over a circuit board, the solder attachments and solder interconnects are each located between two electrically conductive pads (not shown in FIG. 1), often comprising copper. The upper ones of the two electrically conductive pads, (meaning, in the context of FIG. 1, the electrically conductive pad located between surface 162 of organic interposer 160 and solder attachment 110 and between surface 162 of organic interposer 160 and solder interconnects 120) will typically have the same or substantially similar footprints as the underlying solder attachment and solder interconnects and, therefore, for the sake of simplicity and clarity, will be omitted from some of the subsequent drawings. When the upper electrically conductive pads do not have the same or substantially similar footprints as the underlying solder attachment and solder interconnects, then the upper electrically conductive pads are shown in the subsequent drawings. The lower electrically conductive pads may or may not have the same or substantially similar footprints as the corresponding upper electrically conductive pads. Further details regarding the relative placements and sizes of the electrically conductive pads and the solder attachments and solder interconnects will be given in connection with FIGS. 2 and 3.

In the embodiment illustrated in FIG. 1, solder interconnects 120 are arranged in a single line 140. Line 140 is outside of and follows the contours of outer perimeter 111. Also in the embodiment illustrated in FIG. 1, line 140 comprises fewer than one hundred solder interconnects 120. In a particular embodiment, each one of solder interconnects 120 is located entirely outside of outer perimeter 111.

Figure 2:
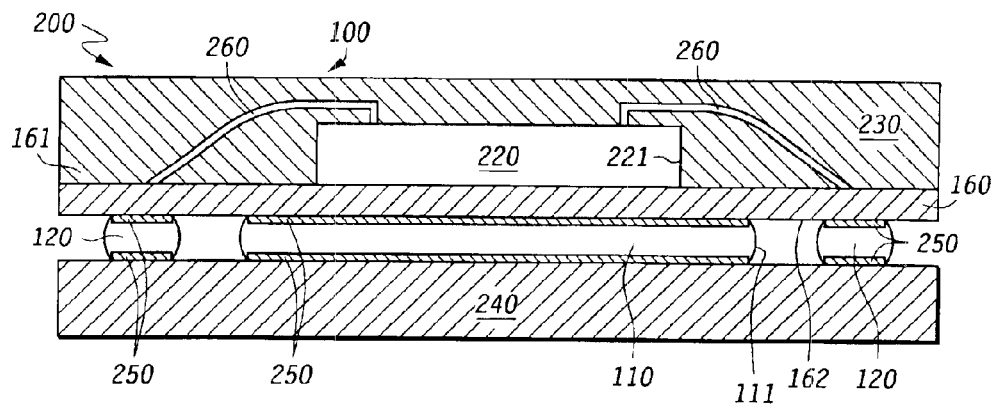
FIG. 2 is a cross-sectional view of the electronic component of FIG. 1 mounted over a circuit board according to an embodiment of the invention.
Figure 3:
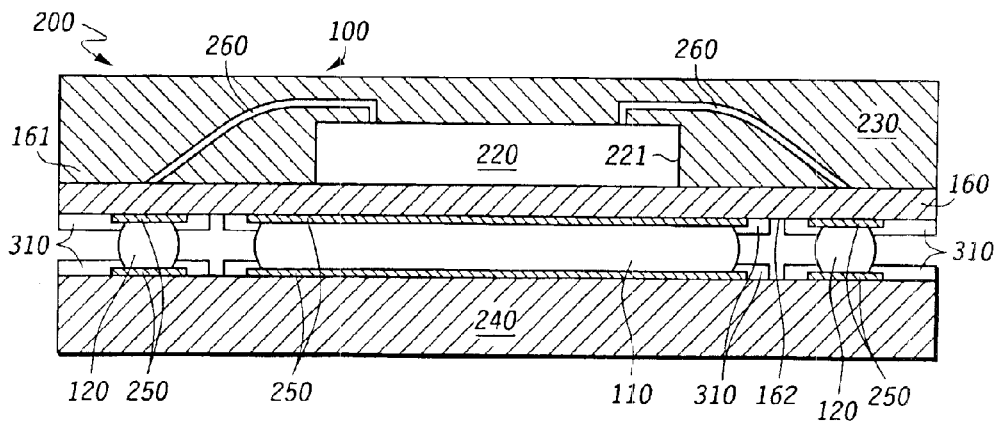
FIG. 3 is a cross-sectional view of the electronic component of FIG. 2 according to another embodiment of the invention.

FIGS. 2 and 3 are cross-sectional views of an electronic component 200, a cross section of which includes electronic component 100 mounted over a circuit board 240. The cross section of electronic component 100 shown in FIGS. 2 and 3 is taken at line 2—2 of FIG. 1. FIG. 2 illustrates a "copper defined" embodiment of electronic component 200 wherein the size and location of solder attachment 10 and solder interconnects 120 are defined by the location of the upper and lower electrically conductive pads, referred to hereinafter as copper pads 250. FIG. 3 illustrates a "solder mask defined" embodiment of electronic component 200 wherein the size and location of solder attachment 110 and solder interconnects 120 are defined by the location of a solder mask 310. Any of the embodiments illustrated in the subsequent figures may be copper defined or solder mask defined embodiments. The copper defined and the solder mask defined embodiments will be more fully explained below.

Referring still to FIGS. 2 and 3, electronic component 100 further comprises a semiconductor chip 220 and a molded package body 230. Copper pads 250 are located above and below solder attachment 110 and solder interconnects 120. Semiconductor chip 220, which may comprise an integrated circuit or several discrete devices, has a perimeter 221. In another embodiment, not shown, electronic component 100 may include multiple semiconductor chips. Semiconductor chip 220 is mounted over and electrically coupled to organic interposer 160. The electrical coupling can be accomplished with wire bonding, flip chip, or other interconnect techniques. In the embodiment illustrated in FIG. 2, semiconductor chip 220 is coupled to organic interposer 160 with wire bonds 260. Organic interposer 160 electrically couples semiconductor chip 220 to solder interconnects 120, which electrically couple semiconductor chip 220 to circuit board 240.

As mentioned above, FIG. 2 illustrates a copper defined embodiment of electronic component 200. A copper defined embodiment is an embodiment wherein the size of solder attachment 110 and solder interconnects 120 is substantially the same as, or slightly wider than, the size of copper pads 250. As an example, a stencil (not shown) may be placed over lower ones of copper pads 250, and solder attachment 110 and solder interconnects 120 may be screen printed through the stencil and onto lower ones of copper pads 250. During a subsequent step, solder attachment 110 and solder interconnects 120 are re-flowed such that they bond to upper copper pads 250.

FIG. 3, as mentioned, illustrates a solder mask defined embodiment of electronic component 200. A solder mask defined embodiment is an embodiment wherein the size of solder attachment 110 and solder interconnects 120 is substantially the same as, or slightly wider than, the size of an opening (not shown) in solder mask 310, and the opening (not shown) in solder mask 310 is smaller than the size of copper pads 250. Solder attachment 110 and solder interconnects 120 may then be deposited using any suitable process, and then re-flowed. As an example, solder interconnects 120 may be deposited using a pick and place process. As another example, solder attachment 110 and solder interconnects 120 may be screen printed onto copper pads 250.

Referring again to both FIG. 2 and FIG. 3, solder attachment 110 is mounted below surface 162 of organic interposer 160 and is located adjacent to at least a portion of perimeter 221 of semiconductor chip 220. Organic interposer 160 comprises surface 162 and a surface 161. In one embodiment, outer perimeter 111 of solder attachment 110 is located directly below perimeter 221 of semiconductor chip 220. In another embodiment, outer perimeter 111 is smaller than and located inside perimeter 221. In yet another embodiment, outer perimeter 111 is larger than and located outside perimeter 221. The phrase "adjacent to," as it is used herein to describe the location of solder attachment 110 in relation to perimeter 221, encompasses each of these embodiments.

An organic interposer can comprise multiple layers of polymeric material separated by multiple layers of thin metal sheets, giving it a composition similar to that of a printed circuit board. As an example, the polymeric material can comprise epoxy, polyimide, or other materials, either with or without reinforcing materials such as glass fibers.

There are many electronic applications, including those that require large numbers of electrical connections, that function best with packages having organic interposers, such as organic interposer 160. One reason for the need for an organic interposer is that large numbers of electrical connections running between a semiconductor chip and a circuit board may be placed within an organic interposer. In view of the various embodiments and applications of organic interposers, the details of organic interposer 160 are not shown in the figures.

In the embodiment illustrated in FIGS. 2 and 3, solder attachment 110 has a larger surface area than a surface area of each of solder interconnects 120. The large surface area of solder attachment 110 increases its structural and mechanical reliability. As was earlier explained herein, existing fine pitch packages suffer reliability problems because the small size of the solder interconnects means the solder interconnects can easily break. Such breaks in the solder interconnects tend to occur with greatest frequency at the locations within an electronic component that experience the greatest stress. Referring still to FIGS. 2 and 3, it has been determined by the present inventors that the locations within electronic component 200 that experience the greatest stress lie below perimeter 221 of semiconductor chip 220. Thus, solder attachment 110 is located below perimeter 221 in electronic component 100. Solder attachment 110 functions in a way similar to each of solder interconnects 120, with the difference between them being that solder attachment 110, with its larger surface area, is better able to withstand the stresses experienced by the area under perimeter 221 than are solder interconnects 120. In one embodiment, however, solder attachment 110 is not used as an electrical interconnect. The higher stress tolerance of solder attachment 110 allows electronic component 100 to offer higher reliability than existing packages, or in other words to function over a greater number of thermal cycles than existing packages do. It should be noted that the thermal resistance of electronic component 100, as measured across solder attachment 110, is at least as good as the typical thermal resistances of existing area array packages.

Figure 4:
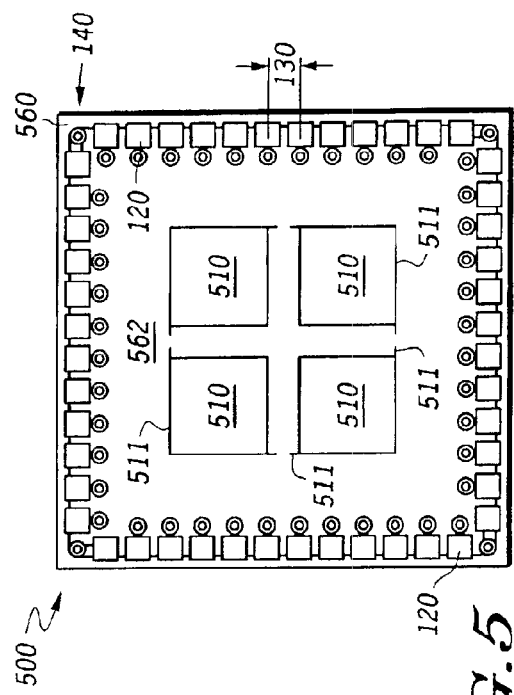
FIG. 4 is a bottom view of an electronic component according to another embodiment of the invention.

Referring now to FIG. 4, which is a bottom view of an electronic component according to another embodiment of the invention, an electronic component 400 comprises solder attachment 110 and solder interconnects 420 located at a surface 462 of an organic interposer 460. The surface area or footprint of solder attachment 110 is larger than a surface area or footprint of each one of solder interconnects 420. Solder interconnects 420 are spherical or round and have pitch 430. In the embodiment illustrated in FIG. 4, solder interconnects 420 are arranged in multiple rows 410. Rows 410, taken together, comprise at least one hundred solder interconnects 420. In the embodiment illustrated in FIG. 4, solder interconnects 420 are located only outside outer perimeter 111.

Except for the number, arrangement, and shape of solder interconnects 420, electronic component 400 can be similar to electronic component 100 in FIGS. 1, 2, and 3. Accordingly, organic interposer 460 can be similar to organic interposer 160 in FIGS. 1, 2, and 3, and electronic component 400 can further comprise a semiconductor chip and a molded package body and can be mounted over a circuit board, although none of these elements are shown in FIG. 4. Nevertheless, the semiconductor chip, the molded package body, the circuit board, and the copper pads can be similar to the corresponding elements of electronic components 100 and 200 in FIGS. 1, 2, and 3.

Figure 5:
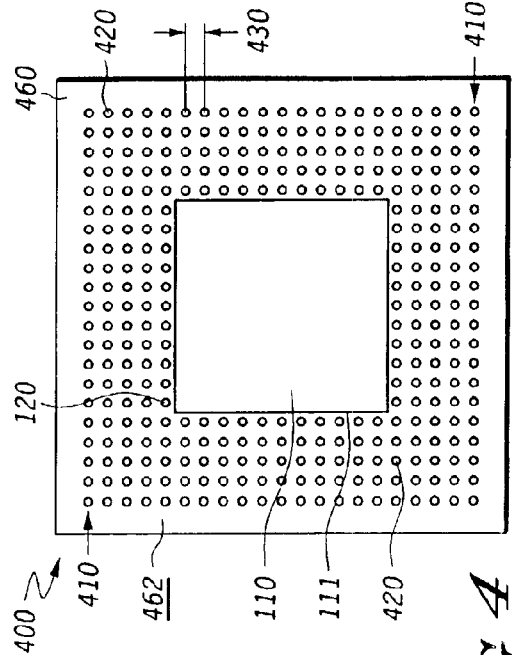
FIG. 5 is a bottom view of an electronic component according to yet another embodiment of the invention.

Referring now to FIG. 5, which is a bottom view of an electronic component according to yet another embodiment of the invention, an electronic component 500 comprises four solder attachments 510 at a surface 562 of an organic interposer 560, and further comprises solder interconnects 120 arranged in a single line 140 under organic interposer 560. A surface area or footprint of each one of solder attachments 510 is larger than the surface area or footprint of each one of solder interconnects 120. Solder interconnects 120 have pitch 130.

Each of solder attachments 510 can be similar to solder attachment 110 in FIG. 1. Solder attachments 510 have an aggregate outer perimeter 511. In the embodiment illustrated in FIG. 5, aggregate outer perimeter 511 is the aggregate perimeter of the entire group of four solder attachments 510, and not the perimeter of each individual one of solder attachments 510. Solder interconnects 120, in the embodiment illustrated in FIG. 5, are located only outside aggregate outer perimeter 511.

It will be understood by one of ordinary skill in the art that, in a different embodiment, electronic component 500 could comprise multiple solder attachments totaling some number other than four. Examples of such an embodiment comprising eight solder attachments are given below in FIGS. 6 and 8. However, it is to be understood that the number of solder attachments is not limited to one, four, or eight; rather, any number of solder attachments may be used.

It has been observed by the present inventors that, in an embodiment where multiple solder attachments 510 are used, such as the embodiment illustrated in FIG. 5, a lack of symmetry among the solder attachments may cause the electronic component, (e.g., electronic component 500), to fail. In the embodiment illustrated in FIG. 5, solder attachments 510 are symmetric across electronic component 500. The word "symmetric," as it is used herein, means that for each solder attachment on one side of a dividing line that divides electronic component 500 into two substantially equal and geometrically balanced halves, there is a corresponding solder attachment on the other side of the dividing line. It is to be understood, however, that "symmetric" does not necessarily mean that the corresponding solder attachments must be exactly alike, or that there must be a mirror-image correspondence in their positions. Accordingly, corresponding solder attachments 110 may be considered symmetric, as that term is used herein, even if the corresponding solder attachments have different shapes and sizes, and/or are located in positions across the dividing line that correspond to each other, but are not exact mirror images of each other.

Except for the difference in the number of solder attachments, electronic component 500 can be similar to electronic component 100 in FIGS. 1, 2, and 3. Accordingly, organic interposer 560 can be similar to organic interposer 160 in FIGS. 1, 2, and 3, and electronic component 500 in FIG. 5 can further comprise a semiconductor chip and a molded package body and can be mounted over a circuit board having copper pads, although none of these elements are shown in FIG. 5. Nevertheless, the semiconductor chip, the molded package body, the circuit board, and the copper pads can be similar to the corresponding elements of electronic component 100 in FIGS. 1, 2, and 3. Aggregate outer perimeter 511 in FIG. 5 can be in the same relationship to the outer perimeter of the semiconductor chip as outer perimeter 111 is to perimeter 221 of semiconductor chip 220 in FIGS. 2 and 3.

Figure 6:
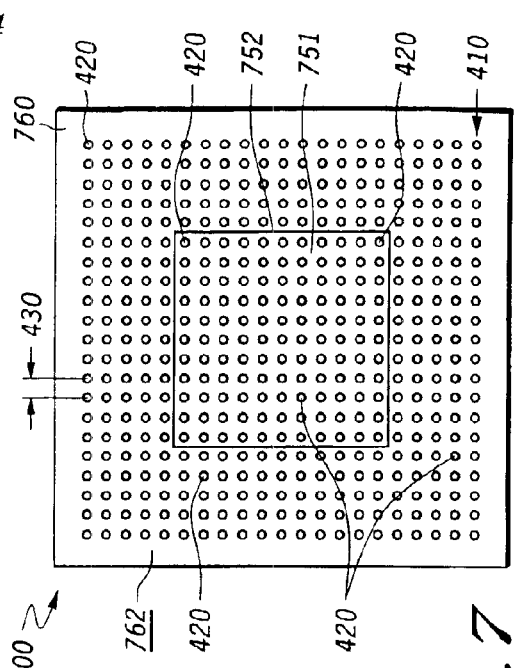
FIG. 6 is a bottom view of an electronic component according to a further embodiment of the invention.

Referring now to FIG. 6, which is a bottom view of an electronic component according to a further embodiment of the invention, an electronic component 600 comprises eight solder attachments 610 and further comprises solder interconnects 420 at a surface 662 of an organic interposer 660. A surface area or footprint of each one of solder attachments 610 is larger than the surface area or footprint of each one of solder interconnects 420. An outline 621 at surface 662 of organic interposer 660 indicates the location of a perimeter of a semiconductor chip overlying an opposite surface of organic interposer 660. The semiconductor chip itself is located above solder attachments 610 and certain ones of solder interconnects 420, and is not visible in FIG. 6. In the embodiment illustrated in FIG. 6, solder interconnects 420 are located inside and outside outline 621, meaning solder interconnects 420 are located both inside and outside the perimeter of the semiconductor chip.

Except for the difference in the number of solder attachments 610 and the location of solder interconnects 420, electronic component 600 can be similar to electronic component 100 in FIGS. 1, 2, and 3. Accordingly, organic interposer 660 can be similar to organic interposer 160 in FIGS. 1, 2, and 3, and electronic component 600 in FIG. 6 can further comprise a semiconductor chip and a molded package body and can be mounted over a circuit board having copper pads, although none of these elements are shown in FIG. 6. Nevertheless, the semiconductor chip, the molded package body, the circuit board, and the copper pads can be similar to the corresponding elements of electronic component 100 in FIGS. 1, 2, and 3.

In the embodiment illustrated in FIG. 6, solder attachments 610 are located, in symmetric fashion, around outline 621. Outline 621, as illustrated in FIG. 6, is a square, though it will be understood that outline 621 could also be rectangular, or some other shape, corresponding to the shape of the overlying semiconductor chip. Solder attachments 610 located at corners of outline 621 are larger than solder attachments 610 centered or located in the middle between the corners of outline 621. In another embodiment, al eight solder attachments 610 may be substantially the same size. In yet another embodiment, solder attachments 610 centered or located in the middle between the corners of outline 621 may be larger than solder attachments 610 located at corners of outline 621. Other embodiments may also be possible, as will be recognized by one of ordinary skill in the art. As is explained in more detail in the following paragraph, the size of solder attachments 610 may be selected, at least in part, based on the stress to which various locations of electronic component 600 are subjected.

As was mentioned earlier herein, the present inventors have observed that the areas of an electronic component that experience the greatest stress tend to be located under the perimeter of the semiconductor chip. For electronic component 600 in FIG. 6, those locations are around outline 621. Of those areas located around outline 621, areas of greater and lesser stress may also be defined. Whether an area located around outline 621 is subjected to greater or lesser stress may depend on, among other things, various structural parameters such as the coefficients of thermal expansion (CTE) of different parts of electronic component 600.

As an example, a circuit board (such as circuit board 240 in FIG. 2) may expand at a rate of approximately fifteen parts per million (ppm) per degree Celsius, while a mold compound used to form a molded package body (such as molded package body 230 in FIG. 2) may expand at a rate of approximately seven ppm per degree Celsius. Given that discrepancy in expansion rates, electronic component 600, during cooling or heating, may be subjected to a significant amount of shearing stress at the corners of outline 621. In such a case, solder attachments 610 located at the corners of outline 621 may be made larger than solder attachments 610 located between corners so as to be able to withstand the greater stress at the corners. On the other hand, if the mold compound expands at the higher rate of approximately 10–12 ppm per degree Celsius, electronic component 600 may instead be subjected to tension-dominant stress, due to bending or bowing, rather than the shear-dominant stress described above. The bending or bowing stress tends to be concentrated between the corners of outline 621. In this latter case, solder attachments 610 centered or located between corners of outline 621 may be made larger than solder attachments 610 at the corners of outline 621 so as to be able to withstand the greater stress between the corners. It will be understood by one of ordinary skill in the art that different packages may respond to differences in CTE among various parts of electronic component 600 in a way that is different from that described above. In general, more solder, i.e., larger solder attachments, will be placed at locations of higher stress.

Figure 7:
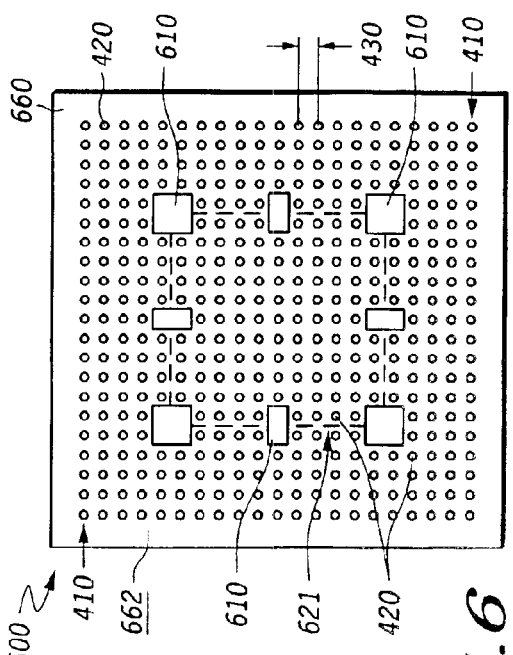
FIG. 7 is a bottom view of an electronic component according to a still further embodiment of the invention.

Referring now to FIG. 7, which is a bottom view of an electronic component according to a still further embodiment of the invention, an electronic component 700 comprises multiple solder interconnects 420 and a single copper pad 751, both underneath a surface 762 of an organic interposer 760. Copper pad 751 is located between solder interconnects 420 and surface 762 of organic interposer 760. Copper pad 751 has a footprint and surface area that is substantially larger than the footprints and surface areas of each one of solder interconnects 420. A perimeter 752 of copper pad 751 is adjacent to a perimeter of an overlying semiconductor chip. Solder interconnects 420 are arranged in multiple rows 410 and have pitch 430. In the embodiment illustrated in FIG. 7, solder interconnects 420 are located both inside and outside perimeter 752, meaning solder interconnects 420 are located both inside and outside a perimeter of an overlying semiconductor chip. As an example, electronic component 700 can be a solder mask defined embodiment, where the solder mask (not shown) defines solder interconnects 420 inside perimeter 752 such that they remain distinct from one another and do not merge together.

Except for the difference in the number and configuration of solder interconnects 420, electronic component 700 can be similar to electronic component 100 in FIGS. 1, 2, and 3. Accordingly, organic interposer 760 can be similar to organic interposer 160 in FIGS. 1, 2, and 3, and electronic component 700 in FIG. 7 can further comprise a semiconductor chip and a molded package body and can be mounted over a circuit board having copper pads, although not all of these elements are shown in FIG. 7. Nevertheless, the semiconductor chip, the molded package body, the circuit board, and the copper pads can be similar to the corresponding elements of electronic component 100 in FIGS. 1, 2, and 3.

Figure 8:
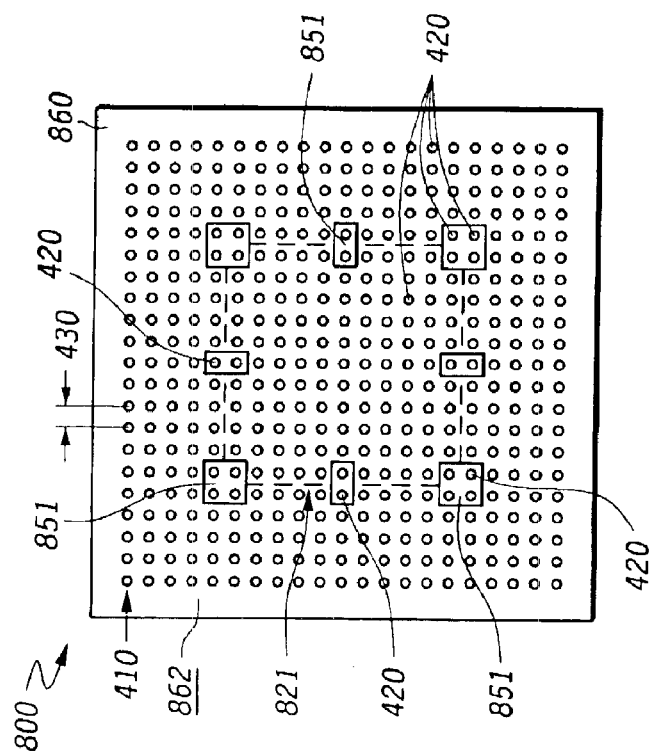
FIG. 8 is a bottom view of an electronic component according to another embodiment of the invention.

Referring now to FIG. 8, which is a bottom view of an electronic component according to another embodiment of the invention, an electronic component 800 comprises multiple copper pads 851 and multiple solder interconnects 420, all underneath a surface 862 of an organic interposer 860. Each one of multiple copper pads 851 underlies at least one solder interconnect 420. Solder interconnects 420 have pitch 430, and are arranged in multiple rows 410. An outline 821 indicates the position of a perimeter of a semiconductor chip, located above copper pads 851 and certain ones of solder interconnects 420 at the other side of organic interposer 860, and which is not visible in FIG. 8. In the embodiment illustrated in FIG. 8, solder interconnects 420 are located both inside and outside outline 821, meaning solder interconnects 420 are located both inside and outside of the perimeter of the semiconductor chip. As an example, electronic component 800 can be a solder mask defined embodiment, where the solder mask (not shown) defines solder interconnects 420 inside outline 821 such that they remain distinct from one another and do not merge together.

Referring still to FIG. 8, copper pads 851 are located around outline 821. The size and placement of copper pads 851 and solder interconnects 420 may be selected according to the same criteria as were mentioned in connection with solder attachments 610 in FIG. 6. Except for the difference in the number and configuration of solder interconnects 420, electronic component 800 can be similar to electronic component 100 in FIGS. 1, 2, and 3. Accordingly, organic interposer 860 can be similar to organic interposer 160 in FIGS. 1, 2, and 3, and electronic component 800 in FIG. 8 can further comprise a semiconductor chip and a molded package body and can be mounted over a circuit board having copper pads, although not all of these elements are shown in FIG. 8. Nevertheless, the semiconductor chip, the molded package body, the circuit board, and the copper pads can be similar to the corresponding elements of electronic component 100 in FIGS. 1, 2, and 3.

Figure 9:
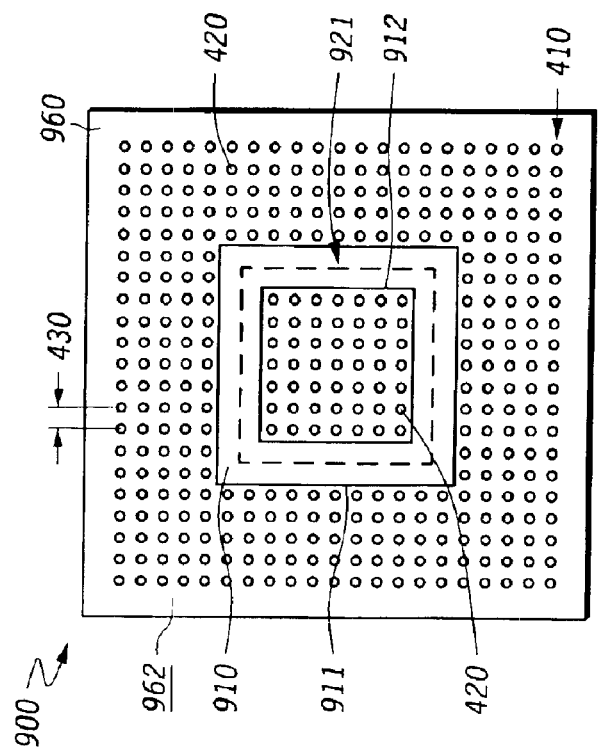
FIG. 9 is a bottom view of an electronic component according to yet another embodiment of the invention.

Referring now to FIG. 9, which is a bottom view of an electronic component according to yet another embodiment of the invention, an electronic component 900 comprises a solder attachment 910 and solder interconnects 420, all underneath a surface 962 of an organic interposer 960. A surface area or footprint of solder attachment 910 is larger than the surface area or footprint of each one of solder interconnects 420. An outline 921 indicates the position of a perimeter of a semiconductor chip, located above solder attachments 910 and certain ones of solder interconnects 420 at the other side of organic interposer 960, and which is not shown in FIG. 9.

Solder attachment 910 has an outer perimeter 911 and an inner perimeter 912, with the solder material comprising solder attachment 910 being located between outer perimeter 911 and inner perimeter 912. Solder attachment 910 is located around outline 921, thus occupying the areas of highest stress within electronic component 900. In the embodiment illustrated in FIG. 9, solder interconnects 420 are located inside and outside outline 921. More specifically, solder interconnects 420 are located inside inner perimeter 912 and outside outer perimeter 911 of solder attachment 910.

Except for the difference in the number and configuration of solder interconnects 420 and the configuration of solder attachment 910, electronic component 900 can be similar to electronic component 100 in FIGS. 1, 2, and 3. Accordingly, organic interposer 960 can be similar to organic interposer 160 in FIGS. 1, 2, and 3, and electronic component 900 in FIG. 9 can further comprise a semiconductor chip and a molded package body and can be mounted over a circuit board having copper pads, although none of these elements are shown in FIG. 9. Nevertheless, the semiconductor chip, the molded package body, the circuit board, and the copper pads can be similar to the corresponding elements of electronic component 100 in FIGS. 1, 2, and 3.

Figure 10:
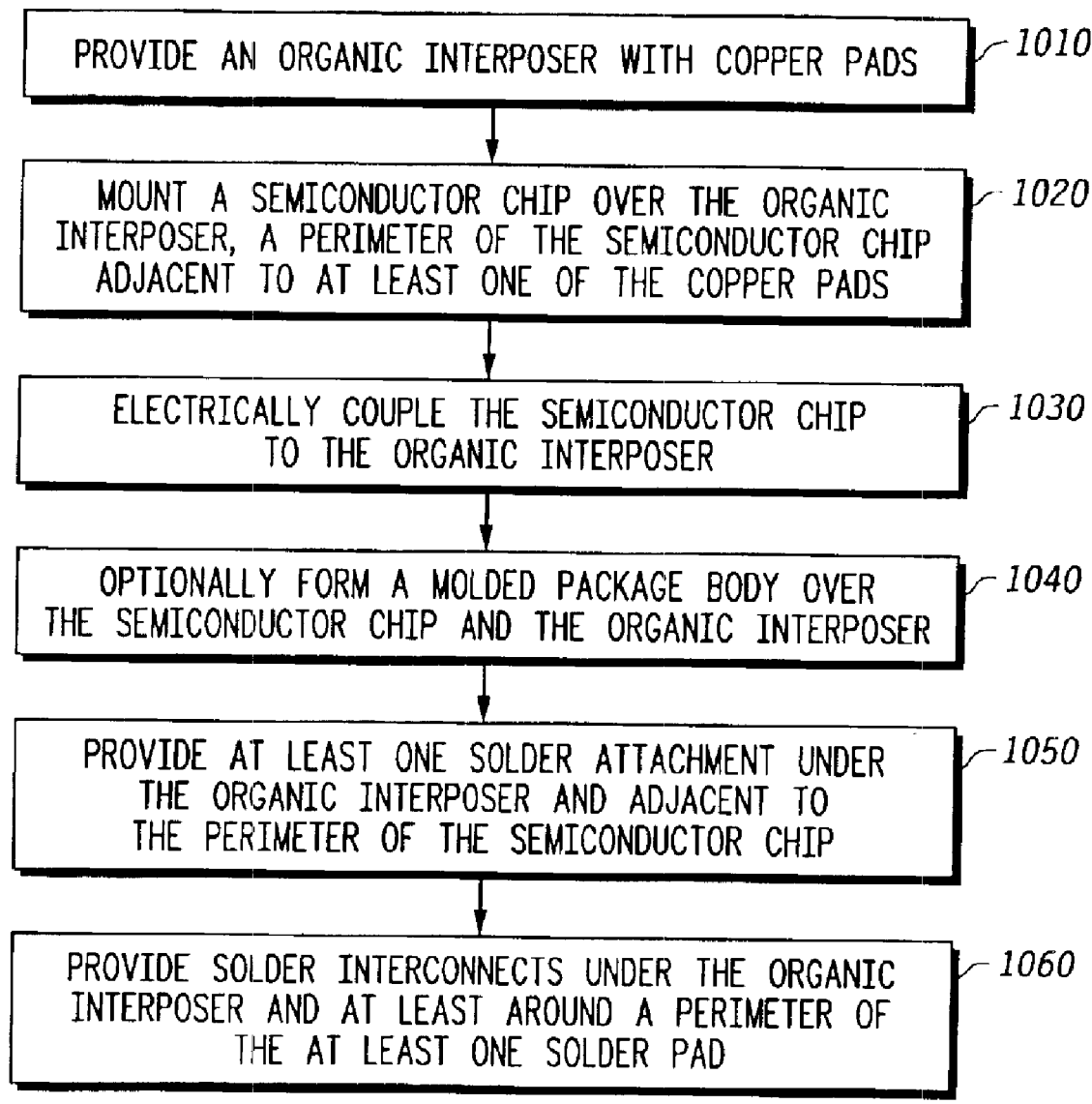
FIG. 10 is a flow chart illustrating a method of manufacturing an electronic component according to an embodiment of the invention.

Refer now to FIG. 10, which is a flow chart illustrating a method 1000 of manufacturing an electronic component according to an embodiment of the invention. A step 1010 of method 1000 is to provide an organic interposer comprising copper pads. As an example, the organic interposer may be manufactured in a manufacturing process, or may be purchased as a pre-manufactured element. The organic interposer can be similar to organic interposers 160, 460, 560, 660, 760, 860, and 960 of FIGS. 1–9. The copper pads can be similar to copper pads 250, 751, and 851 in FIGS. 2, 7, and 8, respectively.

A step 1020 of method 1000 is to mount a semiconductor chip over the organic interposer, where a perimeter of the semiconductor chip is adjacent to at least one of the copper pads. The semiconductor chip may comprise, in one embodiment, an integrated circuit. The semiconductor chip can be similar to semiconductor chip 220 in FIGS. 2 and 3. Step 1020 of method 1000 in FIG. 10 may comprise mounting more than one semiconductor chip above the organic interposer.

A step 1030 of method 1000 is to electrically couple the semiconductor chip to the organic interposer. Step 1030 and step 1020 can be performed simultaneously with each other in some embodiments of method 1000.

An optional step 1040 of method 1000 is to form a molded package body over the semiconductor chip and the organic interposer. The molded package body can be similar to molded package body 230 in FIGS. 2 and 3.

A step 1050 of method 1000 in FIG. 10 is to provide at least one solder attachment under the organic interposer and adjacent to the perimeter of the semiconductor chip. The at least one solder attachment can be similar to solder attachments 110, 510, 610, and 910 referenced in FIGS. 1–9.

A step 1060 of method 1000 in FIG. 10 is to provide solder interconnects under the organic interposer and at least around a perimeter of the at least one solder attachment. The solder interconnects can be similar to solder interconnects 120 and 420 referenced in FIGS. 1–9. Steps 1050 and 1060 can be performed simultaneously in some embodiments of method 1000.

In one embodiment, step 1050 may comprise providing a group of solder attachments, where the solder attachments are symmetric as defined above. Each one of the group of solder attachments may have a surface area that is larger than the surface area of each one of the solder interconnects. The solder attachments may be formed in a stencil printing or solder-mask-defined process. Alternately, the solder attachments may be formed by plating, or in a pick-and-place process wherein the solder attachments are pre-formed and then put into place. A variation of this process comprises picking and placing an entire group, or tray, of solder attachments at once. Other formation processes may also be suitable.

Step 1060 may comprise providing a single line of fewer than one hundred solder interconnects. In another embodiment, step 1060 may comprise providing at least one hundred solder interconnects, and arranging the solder interconnects in more than one row. The multiple rows of solder interconnects thus formed may be arranged only around an outer perimeter of the solder attachment or group of solder attachments, or the multiple rows of solder interconnects may be arranged both inside and outside an outer perimeter of the solder attachment or group of solder attachments. In one embodiment, the arrangement of rows is a symmetric arrangement.

Although the invention has been described with reference to specific embodiments, it will be understood by those skilled in the art to which the invention pertains that various changes may be made without departing from the spirit or scope of the invention. Accordingly, the disclosure of embodiments of the invention is intended to be illustrative of the scope of the invention and is not intended to be limiting. It is intended that the scope of the invention shall be limited only to the extent required by the appended claims. To one of ordinary skill in the art it will be readily apparent that the invention discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims. Moreover, embodiments and limitations disclosed herein are not dedicated to the public under the doctrine of dedication if the embodiments and/or limitations: (1) are not expressly claimed in the claims and (2) are or are potentially equivalents of express elements and/or limitations in the claims under the doctrine of equivalents.

What is claimed is:

1. An electronic component comprising:
   an organic interposer comprising a first surface, a second surface, and a copper pad at the second surface;
   a semiconductor chip mounted over the first surface of the organic interposer;
   a solder attachment under the second surface of the organic interposer and under the copper pad; and
   solder interconnects under the second surface of the organic interposer and located at least outside a perimeter of the solder attachment,
   wherein:
   the solder interconnects have a pitch no treater than approximately one millimeter; and the solder attachment and the copper pad are located adjacent to a perimeter of the semiconductor chip.

2. The electronic component of claim 1 wherein:
the solder attachment has a surface area larger than a surface area of each of the solder interconnects.

3. The electronic component of claim 1 wherein:
the solder interconnects are arranged in multiple rows and comprise at least one hundred solder interconnects.

4. The electronic component of claim 1 wherein:
the solder interconnects are arranged in a single line outside the perimeter of the semiconductor chip and comprise fewer than one hundred solder interconnects.

5. The electronic component of claim 1 wherein:
the solder interconnects are located inside and outside the perimeter of the semiconductor chip.

6. The electronic component of claim 1 wherein:
the solder interconnects are located only outside the perimeter of the semiconductor chip.

7. The electronic component of claim 1 further comprising:
multiple copper pads, including the copper pad, at the second surface of the organic interposer; and
multiple solder attachments, including the solder attachment, at the second surface of the organic interposer,
wherein:
no more than one of the multiple solder attachments is located underneath any one of the multiple copper pads; and
an aggregate perimeter around the multiple copper pads and the multiple solder attachments is adjacent to the perimeter of the semiconductor chip.

8. The electronic component of claim 7 wherein:
the multiple copper pads comprise four copper pads, each one located adjacent to a different corner of the perimeter of the semiconductor chip; and
the multiple solder attachments comprise four solder attachments, each one located adjacent to a different corner of the perimeter of the semiconductor chip.

9. The electronic component of claim 8 wherein:
the multiple solder attachments are symmetric underneath the organic interposer.

10. The electronic component of claim 8 wherein:
the solder interconnects are located only outside the aggregate perimeter of the multiple copper pads and the multiple solder attachments.

11. An electronic component comprising:
an organic interposer comprising a first surface, a second surface, and a copper pad at the second surface;
a semiconductor chip, mounted over the first surface of the organic interposer;
a solder attachment under the second surface of the organic interposer and under the copper pad;
solder interconnects under the second surface of the organic interposer and located at least outside a perimeter of the solder attachment;
multiple copper pads, including the copper pad, at the second surface of the organic interposer; and
multiple solder attachments, including the solder attachment, at the second surface of the organic interposer,
wherein:
the solder attachment and the copper pad are located adjacent to a perimeter of the semiconductor chip;
no more than one of the multiple solder attachments is located underneath any one of the multiple copper pads;
an aggregate perimeter around the multiple copper pads and the multiple solder attachments is adjacent to the perimeter of the semiconductor chip;
the multiple copper pads comprise eight copper pads, each one of the eight copper pads located adjacent to a different corner or a different side of the perimeter of the semiconductor chip; and
the multiple solder attachments comprise eight solder attachments, each one of the eight solder attachments located adjacent to a different corner or a different side of the perimeter of the semiconductor chip.

12. The electronic component of claim 11 wherein:
the multiple solder attachments are symmetric underneath the organic interposer.

13. The electronic component of claim 11 wherein:
the solder interconnects are located inside and outside the aggregate perimeter of the multiple copper pads and the multiple solder attachments.

14. The electronic component of claim 1 further comprising:
multiple copper pads, including the copper pad, at the second surface of the organic interposer;
wherein:
at least one of the multiple copper pads has underneath it more than one of the solder interconnects; and
an aggregate perimeter around the multiple copper pads is adjacent to the perimeter of the semiconductor chip.

15. The electronic component of claim 14 wherein:
the multiple copper pads comprise eight copper pads, each one of the eight copper pads located adjacent to a different corner or a different side of the perimeter of the semiconductor chip.

16. The electronic component of claim 15 wherein:
the multiple copper pads are symmetric underneath the organic interposer.

17. The electronic component of claim 15 wherein:
the solder interconnects are located inside and outside the aggregate perimeter of the multiple copper pads.

18. The electronic component of claim 1 wherein:
the electronic component comprises a single solder attachment consisting of the solder attachment;
an aggregate perimeter around the copper pad and the single solder attachment is adjacent to the perimeter of the semiconductor chip; and
the solder interconnects are located only outside the perimeter of the semiconductor chip.

19. The electronic component of claim 1 wherein:
the electronic component comprises a single solder attachment having an outer perimeter and an inner perimeter; and
the single solder attachment is adjacent to all of the perimeter of the semiconductor chip.

20. The electronic component of claim 19 wherein:
the solder interconnects are located inside the inner perimeter of the single solder attachment and outside the outer perimeter of the single solder attachment.

21. The electronic component of claim 11 wherein:
the solder interconnects have a pitch no greater than approximately one millimeter.

* * * * *

UNITED STATES PATENT AND TRADEMARK OFFICE
CERTIFICATE OF CORRECTION

PATENT NO.    : 6,897,562 B2
DATED         : May 24, 2005
INVENTOR(S)   : Lei L. Mercado et al.

It is certified that error appears in the above-identified patent and that said Letters Patent is hereby corrected as shown below:

Column 10,
Line 66, delete "treater" and replace with -- greater --.

Signed and Sealed this

Sixth Day of December, 2005

JON W. DUDAS
*Director of the United States Patent and Trademark Office*